United States Patent [19]

Genova et al.

[11] Patent Number: 5,128,538
[45] Date of Patent: Jul. 7, 1992

[54] VAPOR EFFUSION SOURCE FOR EPITAXIAL DEPOSITION PLANTS

[75] Inventors: Fernando Genova, Pianezza; Giuliana Morello, Turin, both of Italy

[73] Assignee: Cselt - Centro Studi e Laboratori Telecomunicazioni S.p.A., Turin, Italy

[21] Appl. No.: 679,540

[22] Filed: Apr. 2, 1991

[30] Foreign Application Priority Data

Apr. 19, 1990 [IT] Italy .................. 67289 A/90

[51] Int. Cl.$^5$ .............................. H05H 3/02
[52] U.S. Cl. ......................... 250/251; 342/388; 342/389
[58] Field of Search ............... 250/251; 392/388, 389

[56] References Cited

U.S. PATENT DOCUMENTS 4,565,158  1/1986  Koprio .................. 392/389
4,789,779  12/1988  Drullinger .............. 250/251
5,016,566  5/1991  Levchenko et al. .......... 392/388

Primary Examiner—Jack I. Berman
Assistant Examiner—Kiet T. Nguyen
Attorney, Agent, or Firm—Herbert Dubno

[57] ABSTRACT

An effusion source for epitaxial deposition plants wherein molecular vapor beams are directed towards a substrate to be grown in ultrahigh vacuum environment, which has a first tube, which is airtightly closed at one end by flanges allowing the passage of vapor inlet tubes and is equipped at the the other end with baffle plates and a nozzle for mixing vapors and shaping the molecular beam. A second tube, coaxially joined to the first tube, allows an interstice at ambient pressure and temperature to be obtained in the zone of the vapor mixing and molecular beam shaping, wherein a heating can be located.

2 Claims, 1 Drawing Sheet

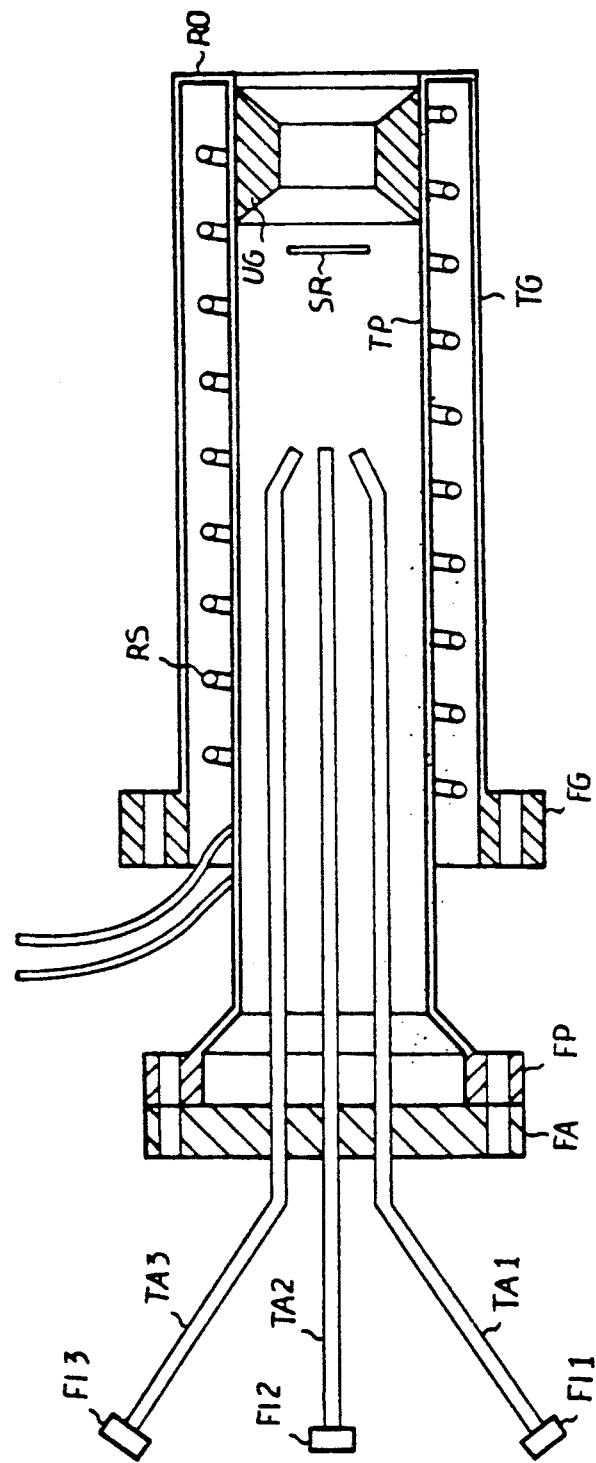

VAPOR EFFUSION SOURCE FOR EPITAXIAL DEPOSITION PLANTS

FIELD OF THE INVENTION

The present invention relates to equipment for preparing crystals for electronic and electro-optic semiconductor devices and more particularly to a vapor effusion source for epitaxial deposition.

BACKGROUND OF THE INVENTION

It is known that the manufacture of electronic and optoelectronic devices, and more particularly those of the hightech type with materials of the III-V groups of the Periodic Table of the elements, requires the deposition of sequences of different single-crystal layers on a starting substrate, in order to obtain appropriate sequences of semiconductor materials. This deposition, prior to the actual fabrication of the individual devices or circuits, must be of the epitaxial type, namely a deposition which maintains starting crystal characteristics, and can be carried out by various techniques. These techniques, those using epitaxial growth from liquid phase (LPE), from vapor phase (VPE) or from a molecular beam (MBE) are well known.

According to this last technique, the materials to be deposited are separately evaporated in an ultrahigh vacuum environment and then sent towards the material to be grown in the shape of a more or less collimated beam. In a variant of this technique, vapors of metal-alkyls of the III group, also-called organo-metallic compounds, are used as vapour sources, ambient temperature these compounds will they present low vapour pressure, differently from the solid metals of the same group, namely Ga, In, Al. In this manner the part of the plant relevant to the vapor source can be placed outside of the ultrahigh vacuum zone. Thus ultrahigh vacuum need not be restored whenever the materials to be evaporated are to be handled. Besides in the vacuum zone there are no high- temperature furnaces for solid metal evaporation, which entail considerable complexity in the plant design to avoid possible material pollution. Finally, vapor state sources can be introduced into the vacuum zones by a single effusion source, wherein they are mixed and directed towards the substrate to be grown, instead of resorting to an effusion source with a separate furnace for each element.

The effusion sources generally used, such as those depicted at page 96 of the book entitled "Molecular Beam Epitaxy" written by M. A. Herman and H. Sitter, Springer-Verlag, edited by Morton B. Panish, are fabricated by using inlet tubes passing through a vacuum flange. The external tube side is equipped with connecting means to vapor lines, while the internal side ends in the zone for mixing the outgoing vapors. This zone is equipped with some baffle plates capable of breaking up the flows outgoing from inlet tubes to enhance vapor mixing, with an outlet nozzle to duly shape the beam directed towards the substrate to be grown and with a heater keeping a constant temperature under the control of an electric thermocouple. The necessity of maintaining the temperature controlled in the effusion source, when the surrounding environment is at the liquid nitrogen temperature, is due to the fact that vapor condensation on the walls, with consequent flow intensity alteration, is to be avoided, without reaching too high temperatures which could give rise to vapor decomposition. Temperature ranging from ambient temperature to 50° C. are required.

This kind of effusion sources is rather difficult to implement, since the sources require vacuum feed-through connectors for the heating and temperature controlling means, which actually are not justified as the temperature to be maintained inside the effusion source is rather low.

OBJECT OF THE INVENTION

It is an object of the invention to overcome these said disadvantages by the vapor effusion source for epitaxial deposition which facilitates temperature control in the vapor mixing zone without requiring the presence of heating and temperature controlling means in the ultra-high vacuum environment.

SUMMARY OF THE INVENTION

According to the present invention an effusion source for epitaxial deposition plants wherein a molecular vapour beam is directed towards a substrate to be grown in ultrahigh vacuum environment, comprises a first tube, hermetically closed at one end by means for carrying vapor inlet tubes and equipped at the other end with baffle plates and with a nozzle for vapor mixing and molecular beam shaping. Characterize in that A second tube, with a diameter greater than that of the first tube and supplied with a vacuum flange, is coaxially joined to the first tube through a round washer, so as to obtain an interstice at ambient temperature and pressure between the outer lateral surface of the first tube and the inner lateral surface of the second tube in the vapour mixing and molecular beam shaping zone.

BRIEF DESCRIPTION OF THE DRAWING

The foregoing and other characteristics of the present invention will be made clearer by the following description of a preferred embodiment thereof, given by way of a non-limiting example, with reference to and the annexed drawing the sole FIG. of which is a cutaway view of the effusion source.

SPECIFIC DESCRIPTION

The vapor effusion source comprises two tubes having different lengths and diameters TP and TG, soldered at one end to a round washer RO so as to be kept in coaxial position, and with two vacuum flanges FP and FG at the other end.

A number of vapor inlet tubes can be introduced into the smaller tube TP. The tubes, denoted by TA1, TA2 and TA3, are in number appropriate to the number of vapor to be introduced, namely 4 or more, and are airtight-soldered to another vacuum flange FA, which perfectly matches with flange FP of the smaller diameter tube TP. They have a length allowing them to penetrate beyond half the smaller diameter tube TP in order to avoid a premature mixing of different vapor rays. The ends of inlet tubes, which remain outside the plant, have convenient flanges Fl1, Fl2, Fl3 for their connection to the vapor sources.

Inside the smaller diameter tube TP, in the outgoing vapor mixing zone, there is the molecular-beam shaping system. It consists of one or more baffle plates SR, for interrupting the direct vapor flow and making the vapor strems follow a tortuous path, and a nozzle UG, allowing the exact definition of the molecular beam shape on the basis of the ratio between its diameter and its length. The entire system is simply screwed to the smaller diameter tube TP so as to be easily replaced according to growth plant requirements and geometry.

Between the outer lateral surface of tube TP and the inner lateral surface of tube TG there is an interstice or space at ambient temperature and pressure, which is generally sufficient to avoid vapor condensation inside tube TP. Anyway, a heating coil RS operated by an electric resistance or by a hot liquid circulation can be provided in the space. Since this coil is not in the ultrahigh vacuum environment, it can be of any commercially available type. The coil input and output pass through the inlet of larger diameter tube TG, which is shorter than the other tube TP.

It is clear that what described has been given only by way of a non-limiting example. Variations and modifications are possible without going out of the scope of the claims.

We claim:

1. An effusion source for epitaxial deposition plants wherein a molecular vapour beam is directed towards a substrate to be grown in ultrahigh vacuum environment, which comprises a first tube, hermetically closed at one end by means for carrying vapor inlet tubes (TA1, TA2, TA3) and equipped at an opposite end with baffle plates and with a nozzle for vapor mixing and molecular beam shaping, and a second tube, with a diameter greater than that of the first tube and supplied with a vacuum flange coaxially joined to the first tube through a round washer, so as to define with the front tube C an interstice at ambient temperature and pressure between an outer lateral surface of the first tube and an inner lateral surface of the second tube in the vapour mixing and molecular beam shaping zone.

2. An effusion source as in claim 1, further comprising heating means in said interstice.

* * * * *